United States Patent
Chen et al.

(10) Patent No.: US 6,490,216 B1
(45) Date of Patent: Dec. 3, 2002

(54) SELECTIVE MEMORY REFRESH CIRCUIT AND METHOD

(75) Inventors: Juei-Lung Chen, Hsinchu (TW); Shih-Huang Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/920,162

(22) Filed: Aug. 1, 2001

(30) Foreign Application Priority Data

Jul. 20, 2001 (TW) ........................................ 90117784 A

(51) Int. Cl.⁷ ................................................. G11C 7/00
(52) U.S. Cl. ................... 365/222; 365/228; 365/189.05
(58) Field of Search ................................. 365/222, 228, 365/185.25, 189.05, 230.08

(56) References Cited

U.S. PATENT DOCUMENTS 6,094,705 A * 7/2000 Song ........................... 365/222
6,178,479 B1 * 1/2001 Vishin ......................... 365/222
6,392,952 B1 * 5/2002 Chen et al. .................. 365/222
6,404,690 B2 * 6/2002 Johnson et al. ............. 365/222

\* cited by examiner

*Primary Examiner*—Tan T. Nguyen
(74) *Attorney, Agent, or Firm*—Charles C. H. Wu; Wu & Cheung, LLP

(57) ABSTRACT

A selective memory refresh circuit for refreshing a memory cell array. The memory cell array has a plurality of word lines connected to a plurality of word line selection circuits for determining if a particular word line needs to be refresh during a refresh cycle. Each word line refresh selection circuit further has a word line address latching device for receiving a word line pre-decode signal, a release signal, a triggering signal and outputting a word line latching signal and a word line refresh compare circuit for receiving the word line pre-decode signal and the word line latching signal and transmitting the result of comparison to a word line driver. When the word line latching signal is at a high level, memory cells attached to the word line are refreshed. On the contrary, when the word line latching signal is at a low level, memory refresh for that word line is skipped.

10 Claims, 5 Drawing Sheets

SELECTIVE MEMORY REFRESH CIRCUIT AND METHOD

CROSS-REFERENCE TO RELATED APPLICATION

This application claims the priority benefit of Taiwan application serial no. 90117784, filed Jul. 20, 2001.

BACKGROUND OF THE INVENTION

1. Field of Invention

The present invention relates to a memory refresh circuit and a memory refresh method. More particularly, the present invention relates to a memory refresh method or circuit capable of refreshing memory cells along a word line containing stored data.

2. Description of Related Art

In general, a dynamic random access memory (DRAM) unit consists of a transistor and a capacitor. By transferring electric charges to the capacitor or discharging electric charges from the capacitor, different storage states such as '1' and '0' are produced. However, some of the charges residing inside the capacitor may leak out over time, leading to a drop in voltage. When sufficient electric charges leak away, different storage states in a memory cell are hard to distinguish. To maintain a particular storage stage, refresh cycles are conducted from time to time so that charges inside the capacitor are replenished. Although refresh cycles can restore a minimal voltage level, refreshing entails current loss and consequently an increase in power consumption.

At present, memory refreshing is conducted on memory cells along all word lines no matter whether a particular word line holds data or not. In other words, word lines that do not hold anything are still refreshed. Ultimately, a longer refreshing cycle than necessary is carried out and more power than necessary is wasted in the refresh operation.

Following the rapid development of portable electronic equipment and the rapid increase in memory capacity, over-consumption of electric power is an important issue. Too much energy wasted in refreshing shortens workable time. Hence, any circuits or methods that can reduce the number of refresh cycles are highly beneficial.

SUMMARY OF THE INVENTION

Accordingly, one object of the present invention is to provide a selective memory refresh circuit and method that refresh memory cells along a word line containing stored data but skip those memory cells along a word line containing no data.

A second object of the invention is to provide a selective memory refresh circuit and method that reduce power consumption and shorten refreshing time in each refresh cycle.

A third object of the invention is to provide a selective memory refresh circuit and method that utilize a release signal to release unused word line addresses so that the unused word lines are skipped during refreshing.

To achieve these and other advantages and in accordance with the purpose of the invention, as embodied and broadly described herein, the invention provides a selective memory refresh circuit for refreshing a memory cell array. The memory cell array comprises of a plurality of rows and columns. The memory cell array also includes a plurality of word lines with each column corresponding to a word line. The selective memory refresh circuit includes a plurality of word line refresh selection circuits coupled to various word lines for determining if the particular word line needs to be refresh during a refresh cycle. The word line refresh selection circuit further includes a word line address latching device and word line refresh comparison circuit. The word line address latching device receives a word line pre-decode signal, a release signal and a triggering signal and outputs a word line latching signal. The word line refresh comparison circuit receives the word line pre-decode signal and the word line latching signal and transmitting the result of comparison to a word line driver. When the triggering signal activates the word line, the word line latching signal becomes a first level signal (for example, a high potential level) to indicate the presence of stored data in the memory cells connected to the word line. On issuing a release signal, the word line latching signal switches to a second level signal (for example, a low potential level) to indicate the absence of stored data in the memory cells connected to the word line. During a refreshing cycle, if the word line latching signal is a first level signal, memory cells along the word line are refreshed. On the contrary, if the word line latching signal is a second level signal, memory refresh of the word line is no longer conducted.

This invention also provides a method for conducting a selective memory refresh. The method is applied to refresh a memory array having a plurality of rows and columns as well as a plurality of word lines, wherein each column corresponds to a word line. First, a refresh cycle is initiated. The plurality of memory cells along a word line is checked to determine if the memory cells contain any stored data. If the word line contains stored data, memory cells along the word line are refreshed. Conversely, if the word line contains no stored data, memory cells along the word line are skipped without conducting a refresh operation. The checking and refreshing steps are repeated until all word lines are processed. When all the word lines are appropriately processed, a refresh cycle is completed.

In brief, if the word line contains stored data, the word line is refreshed. On the contrary, if the word line contains no stored data, refreshing of the word line is not conducted. Applying this scheme to refresh the memory array, refreshing time is shortened and overall power consumption for the refreshing operation is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
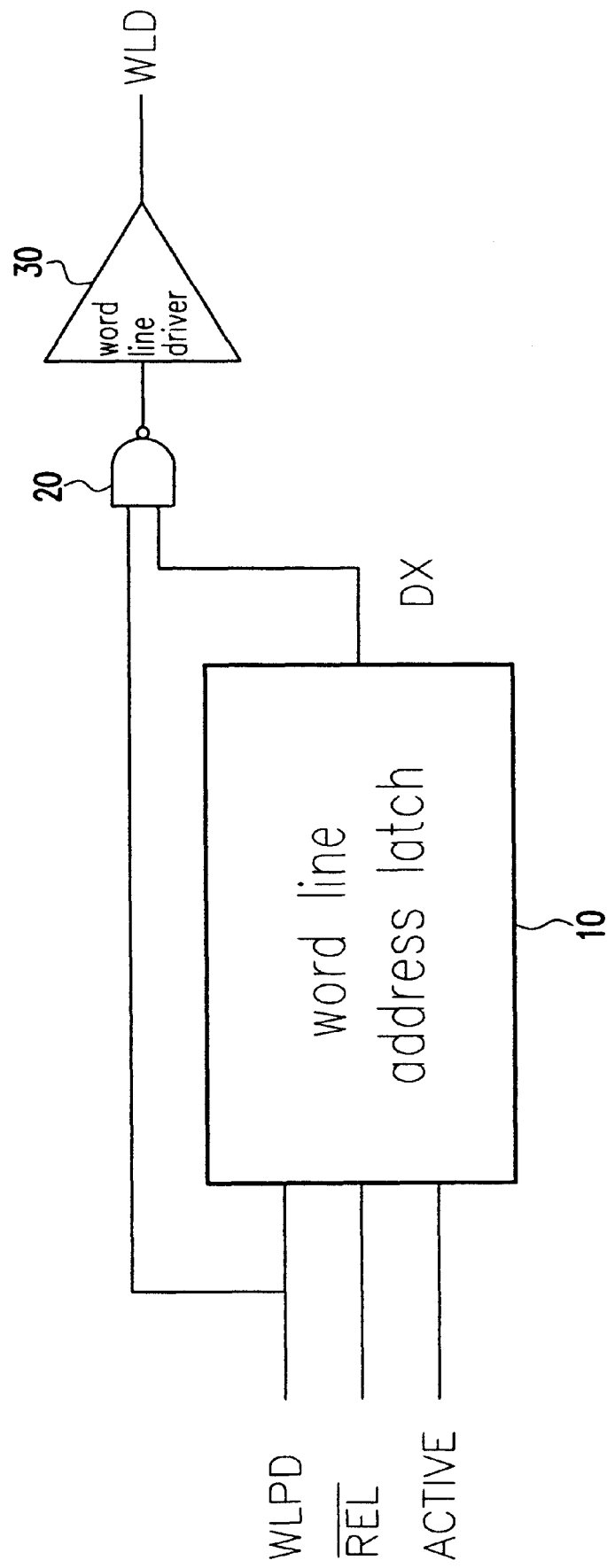
FIG. 1 is a block diagram showing a word line address latching device according to this invention.

Reference will now be made in detail to the present preferred embodiments of the invention, examples of which are illustrated in the accompanying drawings. Wherever possible, the same reference numbers are used in the drawings and the description to refer to the same or like parts.

One major aspect of this invention is the installation of a word line address latching device capable of memorizing a word line address on each bit line (connected to the gate terminal of each memory cell transistor) of a memory array. The latching device determines whether the memory cells on a corresponding word line have been used to stored data or not. If the word line contains stored data, the word line is refreshed during memory refreshing. On the other hand, if the word line holds no stored data, the particular word line is skipped during memory refreshing. Ultimately, refreshing time is shortened and less power is wasted. In addition, this invention may incorporate a release command controller, a word line refresh comparator and a local sense amplifier circuit.

FIG. 1 is a block diagram showing a word line address latching device according to this invention. The word line address latching device 10 is connected to a word line for memorizing whether any memory cells on the word line contain stored data. As shown in FIG. 1, the word line address latching device 10 receives a word line pre-decode (WLPD) signal, an active (ACTIVE) signal, a release (REL) signal and outputs an address latch (DX) signal. After comparing the word line pre-decode (WLPD) signal and the address latch (DX) signal inside a word line refresh comparator 20, the result is transmitted to a word line driver 30 to generate a word line driving signal (WLD) for driving the corresponding word line. The comparator 20 can be a simple logic circuit, for example, a NAND gate as shown in FIG. 1.

The address latching signal (DX) indicates whether the memory cells along the word line connected to the corresponding word line address latching device 10 has been used to record data or not. For example, in this embodiment, DX=1 (signal at a high potential level) implies the memory cells on the word line contain stored data. Conversely, DX=0 (signal at a low potential level) implies the memory cells on the word line contains no stored data. Hence, through the word line address latching device 10, current state (data storage) of each word line in the entire memory array is known.

When the address latching signal DX is '1', the address latching signal DX and the word line pre-decode signal WLPD going into the NAND gate 20 outputs a signal to the word line driver 30 and generates a word line driving signal WLD in turn. The word line driving signal is pulled up to drive the word line.

The active signal ACTIVE triggers the word line. For example, after transmitting a row address strobe (RAS), the ACTIVE command triggers all memory cells along the corresponding word line so that the cells are conductive and ready for a data write or read operation. The release signal REL is used for releasing the word line. In other words, the release command REL is released to pull down the address latching signal DX to indicate no data are stored in the particular word line. The pull-down address latching signal DX and the word line pre-decode signal WLPD are fed to the NAND gate 20 and output from the NAND gate 20 is sent to the word line driver 30 to produce the word line driving signal WLD. The driving signal is pulled down to disable the word line.

Through the address latching signal DX, whether a particular word line contains stored data or not can be determined. If data are stored in the memory cells on a particular word line (for example, DX=1), all the cells along the word line are refreshed during a refresh cycle. On the contrary, if data are absent from the memory cells (for example, DX=0), the memory cells on the particular word line are no longer refreshed during a refresh cycle. Hence, unlike a conventional memory cell refreshing circuits that refresh every word line in each refresh cycle, the memory refresh circuit of this invention selectively refreshes only the memory cells in word lines that contain stored data. Ultimately, refreshing speed is increased and power wastage is reduced.

Figure 2:
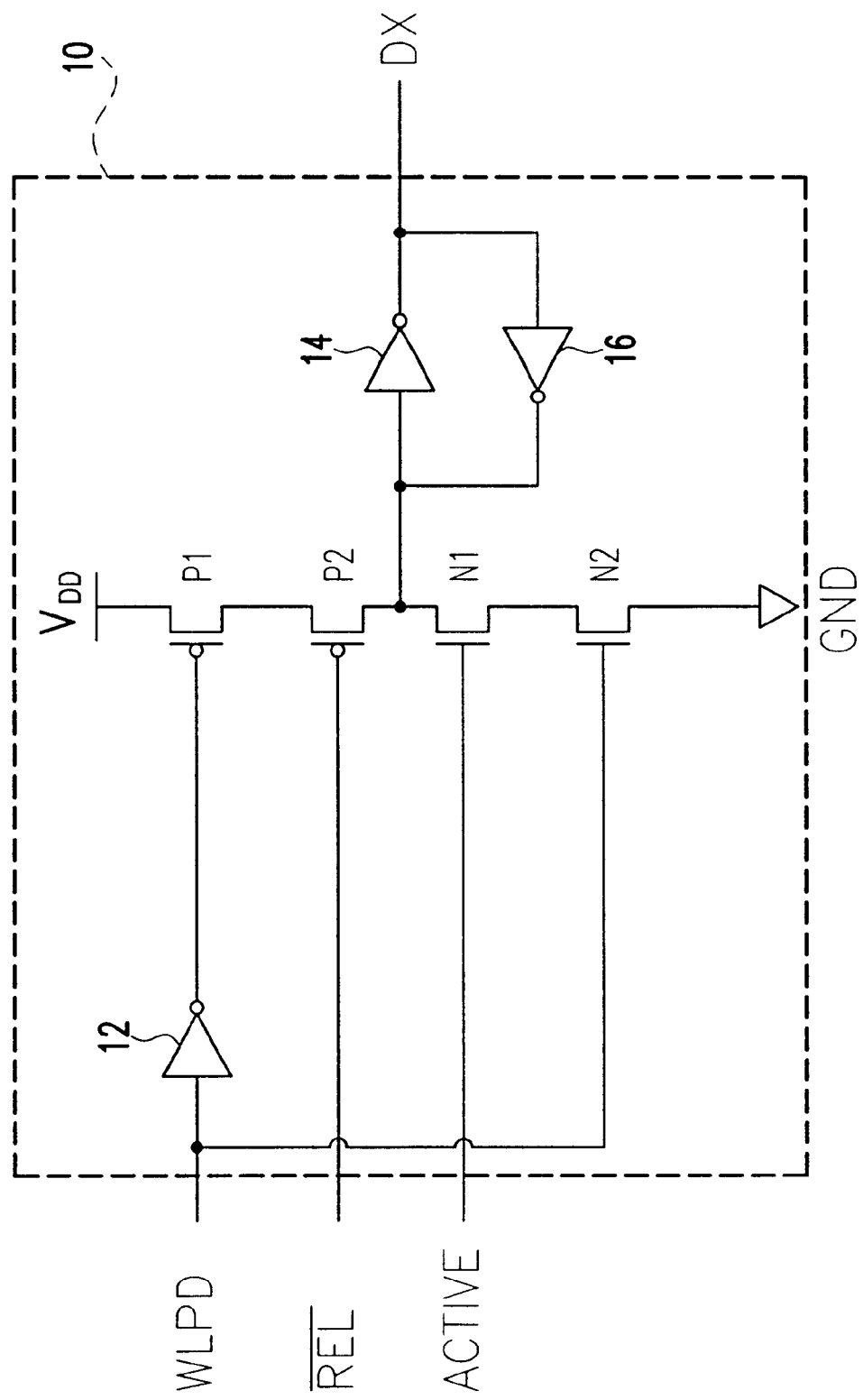
FIG. 2 is an actual circuit diagram of the word line address latching device shown in FIG. 1.

FIG. 2 is an actual circuit diagram of the word line address latching device shown in FIG. 1. As shown in FIG. 2, the word line address latching device is constructed using inverters and metal-oxide-semiconductor (MOS) transistors. The device includes a first inverter 12, a first PMOS transistor P1, a second PMOS transistor P2, a first NMOS transistor N1, a second NMOS transistor N2, a second inverter 14 and a third inverter 16. The inverters 14 and 16 are connected in a feedback manner to form a latching device. The PMOS transistors P1 and P2 are serially connected together between a voltage source and a node point A. The gate terminal of the PMOS transistor P1 is coupled to the output of the inverter 12. The input terminal of the inverter 12 receives the word line pre-decode signal WLPD. The gate terminal of the PMOS transistor P2 receives the release signal REL. The gate terminal of the NMOS transistor N1 receives the triggering signal ACTIVE. The gate terminal of the NMOS transistor N2 receives word line pre-decode signal WLPD. The node point A is connected to the input terminal of the inverter 14. The input terminal of the inverter 16 is connected to the output terminal of the inverter 14 and the output from the inverter 16 is fed back to the input terminal of the inverter 14. The output terminal of the inverter 14 produces the address latching signal DX.

The following describes the operation of the circuit shown in FIG. 2. To write data into one of the word lines in the memory cell array, potential level of the triggering signal ACTIVE is raised. Since the release signal REL is now raised to a high potential level, the NMOS transistor N1 conducts while the PMOS transistor P2 is shut. If the word line pre-decode signal WLPD is at a high potential level, the NMOS transistor N2 also conducts while the node point A is at a low potential. Due to the latching mechanism provided by the inverters 14 and 16, a high address latching signal DX (DX=1) is produced. In other words, the triggering signal ACTIVE renders the memory cells along the word line conductive. In the meantime, the word line address latching device 10 also produces a high address latching signal DX to indicate the presence of stored data in the memory cell of the particular word line. During a refresh operation, the address latching signal DX enables the refresh circuit to refresh the memory cells of the particular word line.

When data are no longer stored in the memory cells of a particular word line of the memory cell array, the release signal REL drops to a low potential. At the same time, the triggering signal ACTIVE also drops to a low potential. Therefore, the PMOS transistor P2 is conductive while the NMOS transistor N1 is shut. The node A rises to a high potential. The latching mechanism provided by the inverters 14 and 16 produces a low address latching signal DX (DX=0). In other words, the memory cell along the word line is shut when the release command REL is issued and the word line address latching device 10 produces a low address latching signal DX to indicate the particular word line has no stored data. Consequently, due to the presence of a low address latching signal DX, memory cells on the particular word line are no longer refreshed during a refresh cycle.

Hence, the memory refresh circuit of this invention no longer has to refresh each word line. Only the word lines containing stored data are refreshed during a refresh cycle. Such selective refreshing property is able to save considerable energy.

Figure 3:
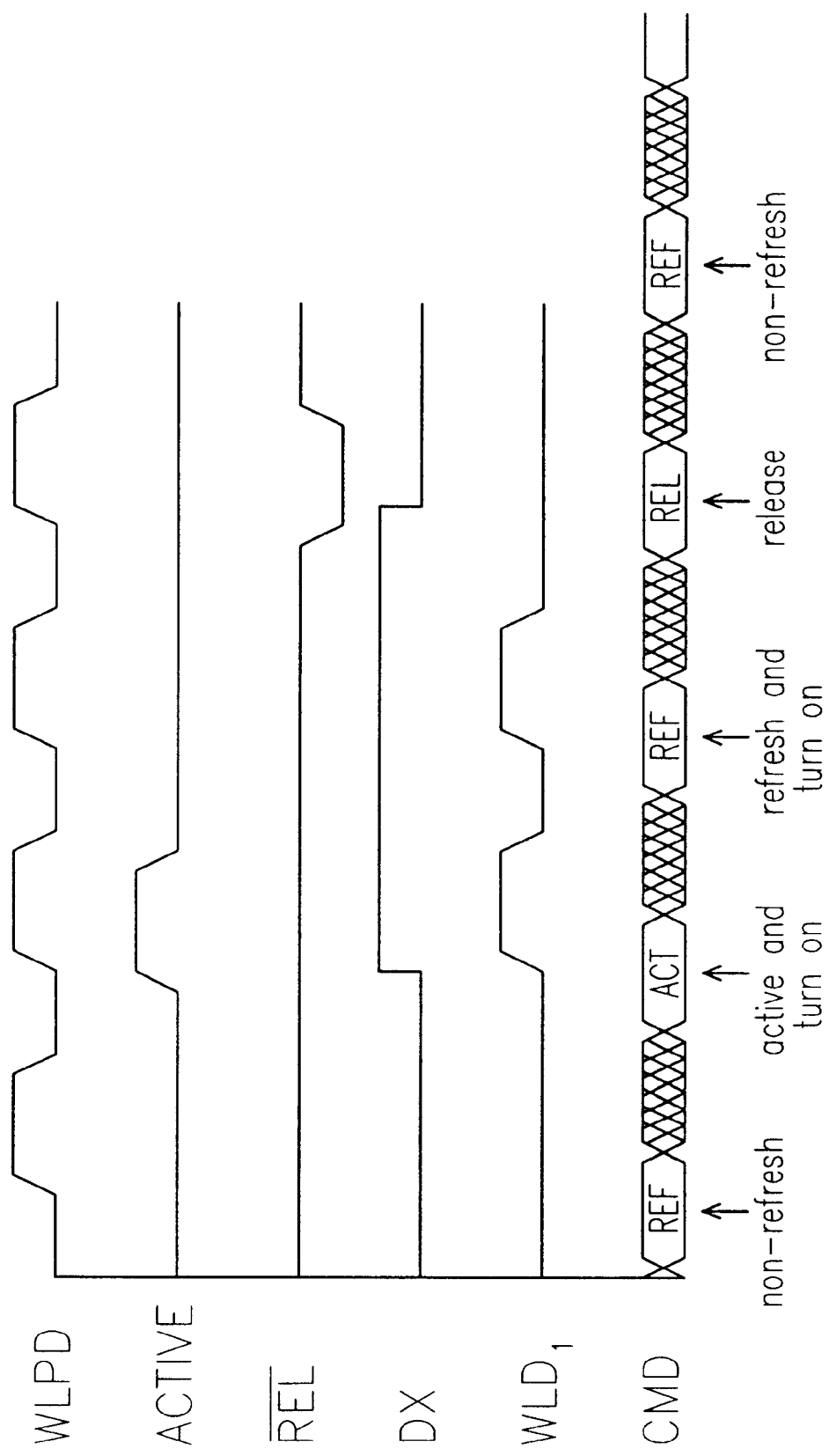
FIG. 3 is a timing diagram showing various signals and data operations produced by the word line latching device shown in FIG. 1.

FIG. 3 is a timing diagram showing various signals and data operations produced by the word line latching device shown in FIG. 1. As shown in FIG. 3, the address latching signal DX rises to a high potential after the triggering signal ACTIVE is activated. The word line driver sends out the word line driving signal WLD. That is, after an active signal ACTIVE is issued from a command bus (CMD), the memory cells is lead to a conductive state and data are written into the memory cells of a corresponding word line. After a refresh cycle, the word line driver submits a word line driving signal WLD and then the command bus CMD issues a refresh command. That is, the memory cells along the word line become conductive to conduct a refresh operation. When the word line no longer stores data, a release signal REL is transmitted and the address latching signal DX is pulled down to a low potential indicating the particular word line no longer hold stored data.

In conducting a refresh operation, memory cells on a word line are refreshed only when the address latching signal DX is at a high potential, indicating the memory cells on the word line contain stored data. If the address latching signal DX is at a low potential, indicating the memory cells of the word line contain no stored data, memory cell on the word line will not be refreshed even when a refresh signal is submitted.

The aforementioned description illustrates the operation on a particular word line. When the word line address latching device of this invention is installed in each word line of the memory array, the memory cells on a word line that contain stored data can be singled out to conduct a memory refreshing operation. Other word lines without any stored data are simply skipped during the refresh operation. Hence, time required to complete a refresh cycle is shortened and current loss during a refresh operation is reduced. Ultimately, energy is saved.

Figure 4:
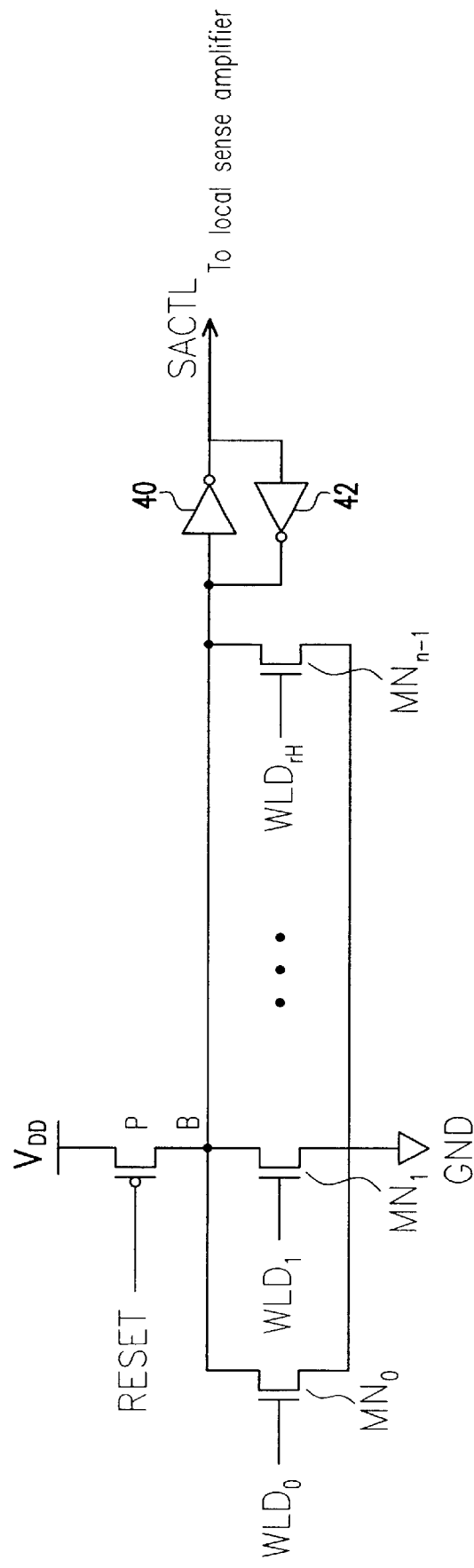
FIG. 4 is a control circuit for the local sense amplifier according to this invention.

FIG. 4 is a control circuit for the local sense amplifier according to this invention. The control circuit serves to shut down the local sense amplifier at the end of each refresh operation. In FIG. 4, only one column of the memory array is shown. The particular row in FIG. 4 includes a plurality of memory cells $MN_0, MN_1, \ldots, MN_{n-1}$. The gate terminal of each memory cell is connected to a corresponding word line WLD0, WLD1, ..., WLDn-1. A switching device such as a PMOS transistor P is connected to the drain terminal of various memory cells. The drain terminal of the PMOS transistor P is also connected to a latching device. The latching device is constructed from a pair of inverters 40 and 42. The gate terminal of the PMOS transistor P is connected to a reset terminal for receiving a reset signal RESET. After refreshing the memory cells $MN_0, MN_1, \ldots, MN_{n-1}$, the memory cells are shut and a reset signal RESET is sent to the gate terminal of the PMOS transistor P. The PMOS transistor P uses a low reset signal RESET to reset the local sense amplifier.

After a refreshing operation, a low reset signal is transmitted to the gate terminal of the PMOS transistor P so that the PMOS transistor is conductive. Meanwhile, all the memory cells $MN_0, MN_1, \ldots, MN_{n-1}$ are shut. Potential level at node point B is pulled up via the PMOS transistor P into voltage $V_{DD}$. Hence, a high potential is sent to the latching device (the pair of feedback connected inverters 40 and 42) and subsequently a latched low output potential also known as a sense amplifier control signal SACTL is produced. The sense amplifier control signal SACTL is transmitted to the local sense amplifier for shutting down the amplifier.

To initiate a refresh operation, the reset signal RESET transits to a high potential so that the PMOS transistor P is shut. During a refreshing operation, the word lines WLD0, WLD1, ..., WLDn-1 are sequentially opened and the potential at node point B is pulled down. Hence, the latching device (the pair of feedback connected inverters 40 and 42) has a low input and produces a high latched sense amplifier control signal SACTL. The sense amplifier control signal SACTL is transmitted to the local sense amplifier for opening up the amplifier.

Utilizing the local sense amplifier control circuit shown in FIG. 4, the local sense amplifier opens only during a refresh operation. At other times, the local sense amplifier remains shut so that much energy is saved.

Figure 5:
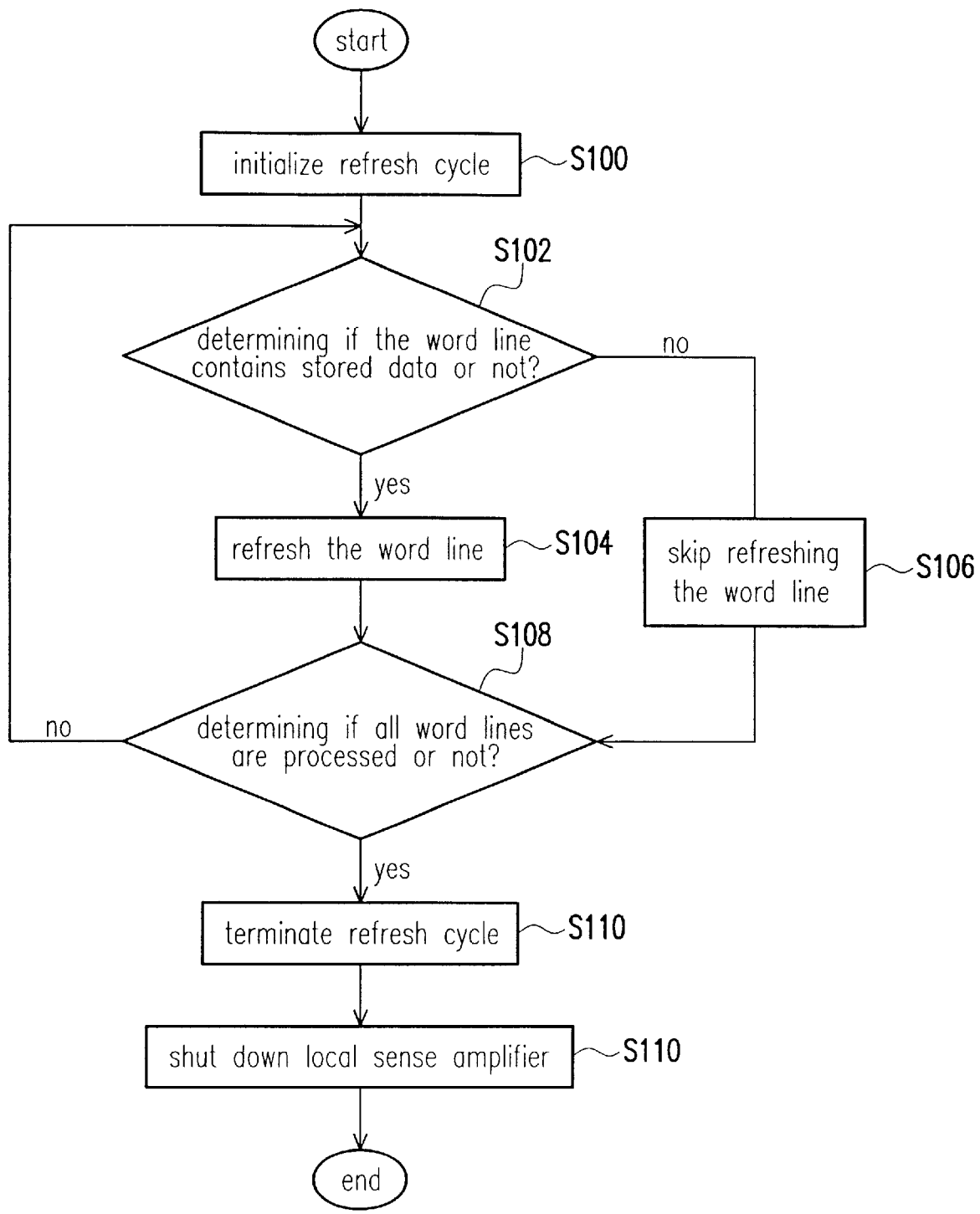
FIG. 5 is a flow chart showing the steps for conducting a selective memory refresh according to this invention.

FIG. 5 is a flow chart showing the steps for conducting a selective memory refresh according to this invention. In step S100, the refresh cycle is initiated to get ready for refreshing stored data within memory cells. In step S102, the memory cells in each word line are checked to determine if any one of them contains stored data. When stored data are found in one of the cells in a word line, step S104 is executed so that the memory cells of the particular word line is refreshed. The next step S108 checks if all word lines are treated. If all word lines are processed, control jumps to step S110, ending the refresh cycle. On the other hand, if some word lines remain unprocessed, control jumps back to step S102.

At the end of the refresh operation, step S112 is executed to shut all local sense amplifiers attached to various columns of the memory array.

One major aspect of this invention is selective refreshing of memory cells along word lines that contain stored data so that word lines containing no stored data are skipped. A word line address latching device is used to latch up the addresses of word lines containing stored data. In other words, a word line latching signal is used to indicate whether a particular word line contains stored data or not.

This invention also provides a selective memory refresh circuit and method that uses a local sense amplifier control circuit to shut down all local sense amplifiers at the end of each refresh operation. In a new refresh operation, the local sense amplifier is opened up when the word line contains stored data.

This invention also provides a selective memory refresh circuit and method that can effectively shorten refreshing time and lower current loss during a refreshing operation. This is because only word lines with stored data are refreshed while word lines containing no stored data are skipped.

Lastly, this invention provides a selective memory refresh circuit and method that use a release signal to release unused word line addresses. Hence, unused word lines are skipped during a refresh operation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A selective memory refresh circuit for refreshing a memory array, wherein the memory array has a plurality of rows and columns as well as a plurality of word lines, and each column corresponds to a word line, the selective memory refresh circuit comprising:

a plurality of word line refresh selection circuits each coupled to a word line for determining which word line requires refreshing in a refresh cycle, each word line refresh selection circuit comprising:

a word line address latching device for receiving a word line pre-decode signal, a release signal, a triggering signal and outputting a word line latching signal; and a word line refresh compare circuit for receiving the word line pre-decode signal and the word line latching signal, comparing the signals and outputting a word line driving signal to a word line driver, wherein when the triggering signal triggers the word line, the word line latching signal is at a first potential level to indicate the memory cells connected to the word line contain stored data, and on releasing a release signal, the word line latching signal is at a second potential level to indicate the memory cells connected to the word line contain no stored data, wherein during a refresh cycle, when the word line latching signal is at the first potential level, the word line is refreshed and when the word line latching signal is at the second potential level, the word line is skipped.

2. The selective memory refresh circuit of claim 1, wherein the word line refresh compare circuit is a combinatorial logic circuit.

3. The selective memory refresh circuit of claim 2, wherein the combinatorial logic circuit includes a NAND gate.

4. The selective memory refresh circuit of claim 2, wherein the word line latching device comprises:

a first inverter for receiving the word line pre-decode signal;

a first PMOS transistor having a source terminal coupled to a voltage source, a gate terminal coupled to an output terminal of the first inverter;

a second PMOS transistor having a source terminal coupled to a drain terminal of the first PMOS transistor and a gate terminal for receiving the release signal;

a first NMOS transistor having a drain terminal coupled to a drain terminal of the second PMOS transistor and a gate terminal for receiving the triggering signal;

a second NMOS transistor having a drain terminal coupled to a source terminal of the first NMOS transistor and a gate terminal for receiving the word line pre-decoded signal; and a latching device coupled to the drain terminal of the first NMOS transistor and outputting the word line latching signal.

5. The selective memory refresh circuit of claim 4, wherein the latching device further includes a second inverter and a third inverter feedback connected together.

6. The selective memory refreshing circuit of claim 1, wherein the circuit further includes a plurality of local sense amplifier control circuits that couple with respective columns of the memory array for controlling opening and closing of a local sense amplifier connected to each column.

7. The selective memory refresh circuit of claim 6, wherein the local sense amplifier control circuit comprises:

a switching circuit for receiving a reset signal, wherein the switching circuit is coupled to the column of the memory array; and a latching circuit coupled to the column of the memory array for outputting a local sense amplifier control signal to the local sense amplifier according to the reset signal.

8. The selective memory refresh circuit of claim 7, wherein the latching device comprises two inverters feedback connected together.

9. A method of conducting a selective memory refresh of a memory array, wherein the memory array has a plurality of rows and columns as well as a plurality of word lines, and each column corresponds to a word line, the method comprising:

initiating a refresh cycle;

determining if the memory cells connected to a particular word line contains stored data;

refreshing the word line if the word line contains stored data and skipping the memory refresh if the word line does not contain any stored data;

determining if the all word lines are processed; and terminating the refresh operation when all word lines are processed.

10. The method of claim 9, wherein after the termination of a refresh operation, further includes shutting down all column connected local sense amplifiers.

* * * * *